(12) United States Patent
Lee et al.

(10) Patent No.: US 7,759,771 B2
(45) Date of Patent: Jul. 20, 2010

(54) RESISTANCE RANDOM ACCESS MEMORY AND METHOD OF MANUFACTURING THE SAME

(75) Inventors: Myoung-jae Lee, Suwon-si (KR); Eun-hong Lee, Anyang-si (KR); Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/896,007

(22) Filed: Aug. 29, 2007

(65) Prior Publication Data
US 2008/0164568 A1 Jul. 10, 2008

(30) Foreign Application Priority Data
Jan. 4, 2007 (KR) .................. 10-2007-0001160

(51) Int. Cl.
*H01L 29/00* (2006.01)
*H01L 21/20* (2006.01)
(52) U.S. Cl. ................ 257/537; 257/536; 257/E29.001
(58) Field of Classification Search .............. 257/2, 257/536–539, 280–298; 438/48, 57, 71
See application file for complete search history.

(56) References Cited

U.S. PATENT DOCUMENTS

| | | | | |
|---|---|---|---|---|
| 5,923,056 A * | 7/1999 | Lee et al. | ..................... | 257/192 |
| 2004/0245557 A1 | 12/2004 | Seo et al. | | |
| 2006/0054950 A1* | 3/2006 | Baek et al. | .................. | 257/295 |
| 2007/0114587 A1 | 5/2007 | Seo et al. | | |
| 2007/0120124 A1* | 5/2007 | Chen et al. | ..................... | 257/43 |
| 2007/0246832 A1* | 10/2007 | Odagawa et al. | ............ | 257/763 |
| 2007/0267667 A1* | 11/2007 | Ufert | ........................... | 257/295 |
| 2007/0269683 A1* | 11/2007 | Chen et al. | .................. | 428/697 |

FOREIGN PATENT DOCUMENTS

KR 1020060040517 A 5/2006

* cited by examiner

*Primary Examiner*—Fernando L Toledo
*Assistant Examiner*—Mamadou Diallo
(74) *Attorney, Agent, or Firm*—Harness, Dickey & Pierce, PLC (57) ABSTRACT

Provided are a resistance random access memory including a resistance layer having a metal oxide and/or a metal ion dopant, which may be deposited at room temperature and which may have variable resistance characteristics, and a method of manufacturing the same.

19 Claims, 6 Drawing Sheets

RESISTANCE RANDOM ACCESS MEMORY AND METHOD OF MANUFACTURING THE SAME

PRIORITY STATEMENT

This application claims priority under 35 USC §119 to Korean Patent Application No. 2007-0001160, filed on Jan. 4, 2007, in the Korean Intellectual Property Office (KIPO), the entire contents of which are herein incorporated by reference.

BACKGROUND

1. Field

Example embodiments relate to a resistance random access memory (RRAM) including a resistance layer having a metal oxide and/or a metal ion dopant and a method of manufacturing the same. The resistance layer of the RRAM may be formed at a lower temperature and may have better electrical characteristics, and thus an RRAM including the resistance layer may be more reliable and may be manufactured in a more cost-effective manner.

2. Description of Related Art

A semiconductor memory array includes many memory cells connected in a circuit. In a Dynamic Random Access Memory (DRAM), which is an example of a semiconductor memory device, a unit memory cell is composed of a switch and a capacitor. A DRAM is advantageous in that the DRAM has a higher degree of integration and operates at higher speeds. However, when the power supply to the DRAM is discontinued, all data stored in the DRAM is lost.

A flash memory device is an example of a nonvolatile memory device in which stored data is maintained even if the power supply is discontinued. However, although flash memory devices have nonvolatile characteristics unlike a volatile memory device, the degree of integration and operating speed thereof is less than those of a DRAM.

A vast amount of research has been conducted on nonvolatile memory devices (e.g., Magnetic Random Access Memory (MRAM), Ferroelectric Random Access Memory (FRAM), and Phase-change Random Access Memory (PRAM)).

In a MRAM, data is stored by changing the magnetization direction in the tunnel junction. In a FRAM, data is stored using polarization characteristics of ferroelectrics. Both MRAM and FRAM have advantages and disadvantages, The PRAM includes a resistor and a switch (transistor), and stores data using the change in the resistance value caused by a phase change in a specific material. In a PRAM manufacturing process, an etching process cannot easily be performed when a conventional DRAM process is used. The etching process takes a longer time. Thus, the yield of the PRAM may decrease, and thereby, increase PRAM manufacturing costs.

The RRAM uses the variable resistance characteristics of a transition metal oxide in that the resistance value varies according to the applied voltage.

An example of a material that is used to form an RRAM is NiO. A NiO layer can have various current-voltage characteristics according to the deposition temperature.

Figure 1A:
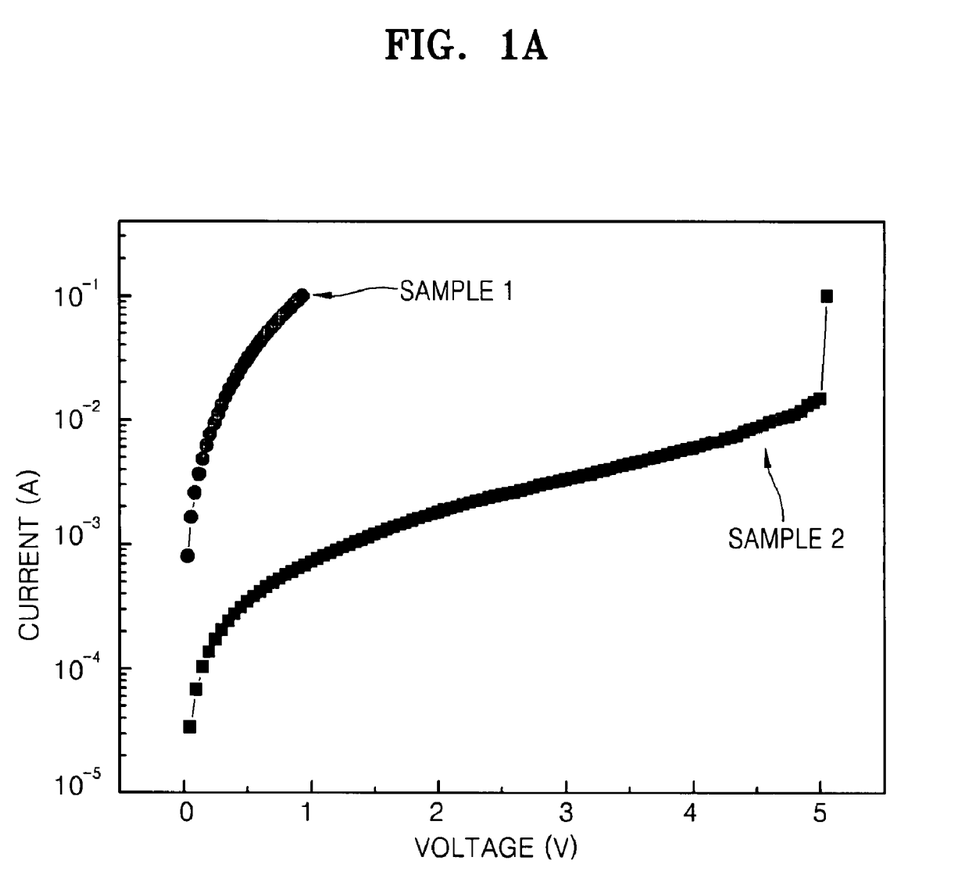
FIG. 1A is a graph illustrating current-voltage characteristics of a NiO layer (Sample 1) obtained using a deposition at room temperature and a NiO layer (Sample 2) obtained using a deposition at a higher temperature.

The current-voltage characteristics of the NiO layer are illustrated in FIG. 1A.

Figure 1B:
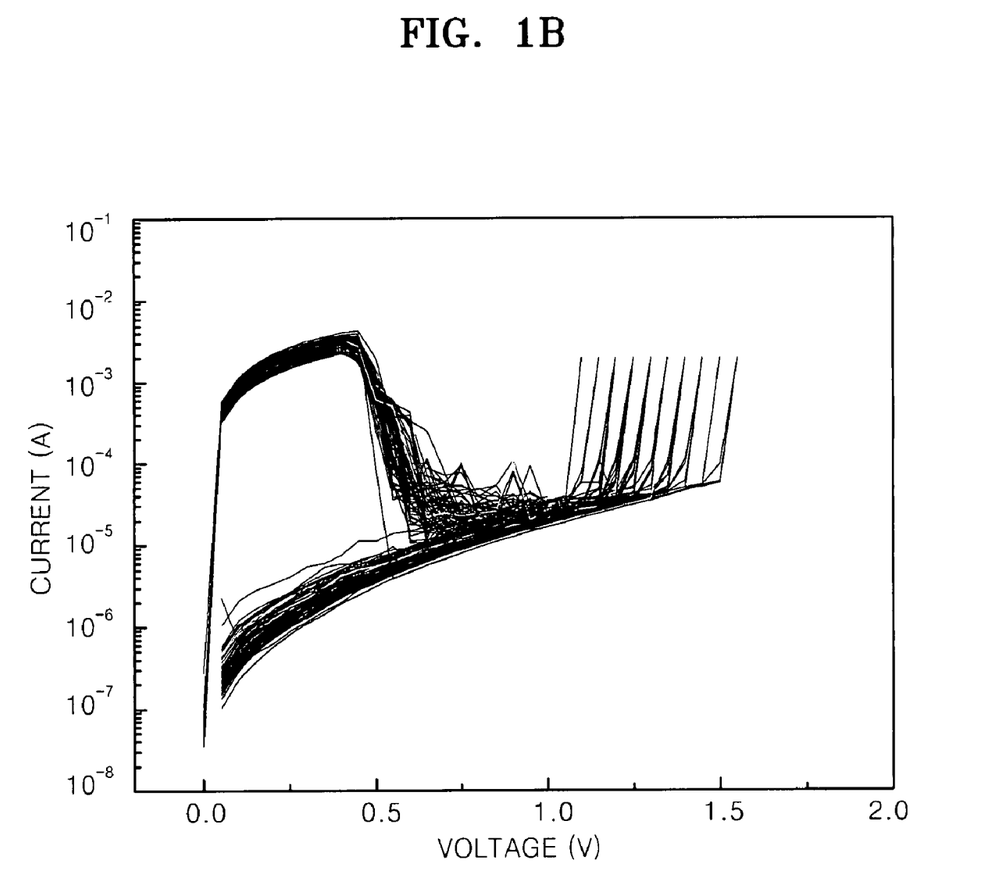
FIG. 1B is a graph illustrating variable resistance characteristics of Sample 2.

In FIG. 1A, Sample 1 is a NiO layer deposited at room temperature using a sputtering method, and Sample 2 is a NiO layer deposited at a temperature of about 350° C. using a sputtering method. According to the current-voltage characteristics of Sample 1 that is deposited at room temperature, Sample 1 does not have variable resistance characteristics. On the other hand, according to the current-voltage characteristics of Sample 2 that is deposited at a temperature of about 350° C., Sample 2 has variable resistance characteristics. These results can be observed in FIG. 1B, which illustrates variable resistance characteristics of Sample 2 for a voltage in the range of 0.0-2.0 V.

Because Sample 1 is deposited at a lower temperature, Sample 1 does not have variable resistance characteristics, and thus Sample 1 cannot be used as an RRAM. However, a lower temperature deposition may be useful to reduce the manufacturing costs or to use a flexible substrate, for example, a plastic substrate.

SUMMARY

Example embodiments provide a resistance random access memory (RRAM) including a resistance layer, which may be formed using a lower temperature deposition and which may have better electrical characteristics, for reducing the manufacturing costs of the memory and for providing a more flexible device, and a method of manufacturing the same.

According to example embodiments, a resistance random access memory may include a lower electrode, a resistance layer having a metal oxide and/or a metal ion dopant on the lower electrode, and an upper electrode on the resistance layer.

The metal oxide in the resistance layer may be at least one oxide selected from the group consisting of a Ni oxide, a Ti oxide, a Hf oxide, a Zr oxide, a Zn oxide, a W oxide, a Co oxide, and a Nb oxide.

The metal ion dopant in the resistance layer may be a transition metal ion. The metal ion dopant in the resistance layer may be substituted at the metal site of the metal oxide to be bound to oxygen. The amount of the metal ion dopant in the resistance layer may be in the range of about 0.0001-5 wt %.

According to example embodiments a method of manufacturing a resistance random access memory may include forming a lower electrode, forming a resistance layer having a metal oxide and/or a metal ion dopant on the lower electrode, and forming an upper electrode on the resistance layer.

The resistance layer may be formed at a temperature in the range from room temperature (about 25° C.) to about 200° C.

Example embodiments provide a resistance random access memory (RRAM) that have a higher degree of integration, operates at higher speeds and lower power levels, and/or has higher data retention characteristics.

Example embodiments provide a resistance layer formed using a lower temperature deposition and/or having better variable resistance characteristics for use, for example, in an RRAM.

BRIEF DESCRIPTION OF THE DRAWINGS

Example embodiments will be more clearly understood from the following detailed description taken in conjunction with the accompanying drawings. FIGS. 1A-5 represent non-limiting, example embodiments as described herein.

DETAILED DESCRIPTION OF EXAMPLE EMBODIMENTS

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
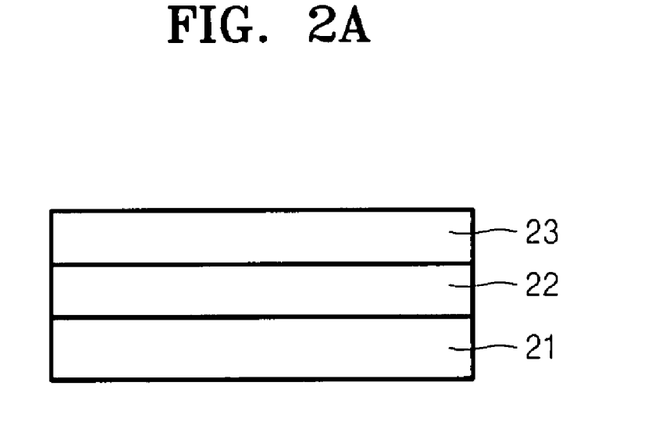
FIG. 2A is a cross-sectional view illustrating a resistance random access memory according to example embodiments.

FIG. 2A is a cross-sectional view illustrating a resistance random access memory (RRAM) according to example embodiments.

Referring to FIG. 2A, a resistance layer 22 having a metal oxide and/or a metal ion dopant may be formed on a lower electrode 21, and an upper electrode 23 may be formed on the resistance layer 22.

The lower electrode 21 and the upper electrode 23 may be formed using an electrode material that may be conventionally used to manufacture a semiconductor device (e.g., Al, Hf, Zr, Zn, W, Co, Au, Pt, Ru, Ir, Ti, or a conductive metal oxide). However, the electrode material is not limited thereto.

The metal oxide of the resistance layer 22 may be a Ni oxide, a Ti oxide, a Hf oxide, a Zr oxide, a Zn oxide, a W oxide, a Co oxide, a Nb oxide, or etc. (e.g., NiO, $TiO_2$, HfO, ZrO, ZnO, $WO_3$, CoO, $Nb_2O_5$, or similar), but is not limited thereto. Hence, at least two of the metal oxides may be combined to be used as the metal oxide of the resistance layer 22.

The metal ion dopant of the resistance layer 22 may be a transition metal ion. For example, the metal ion dopant may be at least one ion selected from the group consisting of a Ni ion, a Ti ion, a Hf ion, a Zr ion, a Zn ion, a W ion, a Co ion, and a Nb ion. In particular, the metal ion dopant may be at least one ion selected from the group consisting of a $Ni^{+2}$ ion, a $Ti^{+4}$ ion, a $Hf^{+3}$ ion, a $Zr^{+3}$ ion, a $Zn^{+3}$ ion, a $W^{+3}$ ion, a $Co^{+2}$ ion, and a $Nb^{+2}$ ion.

The metal ion dopant of the resistance layer 22 may be substituted at the metal site of the metal oxide in the resistance layer 22 that is to be bound to oxygen. For example, when the metal oxide is NiO and the metal ion dopant is a Ti ion in the resistance layer 22, the Ti ion may be substituted at the Ni site of the NiO and a residue electron may compensate for a hole. Thus, even when the resistance layer 22 is formed at a lower temperature (e.g., a temperature in the range from about room temperature to about 200° C.), the resistance layer 22 may have better electrical characteristics.

The amount of metal ion dopant in the resistance layer 22 may be in the range of about 0.0001-5 wt %, for example, 0.001-1 wt %, in order to have better electrical characteristics even when the resistance layer 22 is formed at a lower temperature.

The RRAM according to example embodiments may operate in a 1S (Switch)-1R (Resistance) system in which the RRAM is connected to a transistor or a switch, for example, a diode.

Figure 2B:
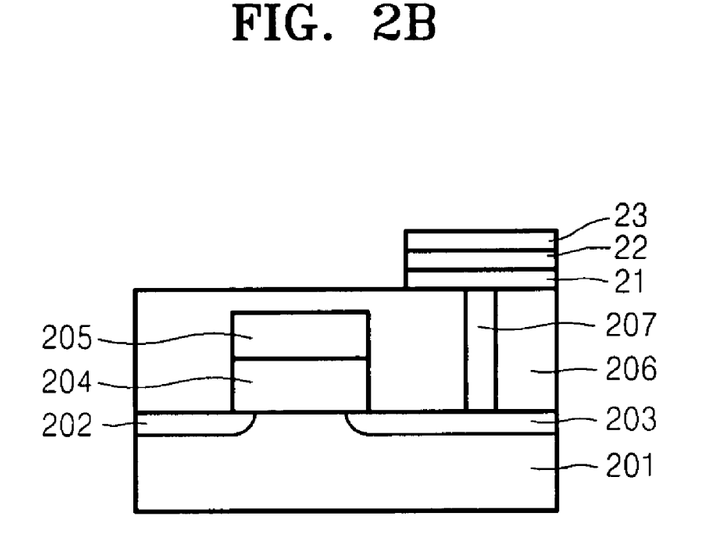
FIG. 2B is a cross-sectional view illustrating a resistance random access memory, which may be disposed on a transistor, according to example embodiments.

FIG. 2B is a cross-sectional view illustrating a 1T (transistor)-1R (resistance) structure in which an RRAM according to example embodiments is connected to a transistor.

Referring to FIG. 2B, a gate structure, which may contact a first impurity region 202 and a second impurity region 203, may be formed on a substrate 201 including the first impurity region 202 and the second impurity region 203. The gate structure may include a gate insulating layer 204 and a gate electrode layer 205. An interlayer insulating layer 206 may be formed between the substrate 201 and the gate structure, and a contact plug 207 may be formed within the interlayer insulating layer 206 on the first impurity region 202 or the second impurity region 203. The RRAM according to example embodiments may be formed on the contact plug 207. The lower electrode 21, the resistance layer 22, and the upper electrode 23 of the RRAM are the same elements as those described above. The RRAM may be connected to a diode structure including a p-type semiconductor layer and a n-type semiconductor layer instead of the transistor as described above.

A method of manufacturing an RRAM according to example embodiments may include forming a lower electrode 21, forming a resistance layer 22 having a metal oxide and/or a metal ion dopant on the lower electrode 21, and forming an upper electrode 23 on the resistance layer 22.

The resistance layer 22 may be formed at a lower temperature, for example, at a temperature in the range from room temperature (about 25° C.) to about 200° C. Referring to FIG. 1A, Sample 1, a NiO layer deposited at room temperature, may not have sufficient variable resistance characteristics. However, the RRAM of example embodiments may include a resistance layer having a metal oxide and a metal ion dopant, and thus, the RRAM may have better variable resistance characteristics even when the resistance layer is deposited at a lower temperature (e.g., in the range from room temperature (about 25° C.) to about 200° C.) as described above. This result may be observed in examples that will be described later. Accordingly, the RRAM of example embodiments may be manufactured in a more cost-effective manner and may be formed on a more flexible substrate, for example, a plastic substrate.

The metal oxide and the metal ion dopant in the resistance layer 22 are the same as those described above.

The resistance layer 22 of the RRAM may be formed by a deposition using a metal target doped with the metal ion dopant. Examples of the metal ion dopant may be at least one ion selected from the group consisting of a Ni ion, a Ti ion, a Hf ion, a Zr ion, a Zn ion, a W ion, a Co ion, and a Nb ion, and more particularly, one selected from the group consisting of a $Ni^{+2}$ ion, a $Ti^{+4}$ ion, a $Hf^{+3}$ ion, a $Zr^{+3}$ ion, a $Zn^{+3}$ ion, a $W^{+3}$ ion, a $Co^{+2}$ ion, and a $Nb^{+2}$ ion.

The amount of doped metal ion dopant may be in the range of about 0.0001-5 wt %, for example, 0.001-1 wt %, in consideration of the amount of metal ion dopant that may be included in the resistance layer 22 that is to be formed after deposition.

The resistance layer 22 may be formed by a deposition using at least two metal targets, for example, at least two targets selected from the group consisting of a Ni target, a Ti target, a Hf target, a Zr target, a Zn target, a W target, a Co target, and a Nb target.

The resistance layer 22 may be formed using various deposition methods, (e.g., a sputtering, a chemical vapor deposition (CVD), a plasma vapor deposition (PVD), or an atomic layer deposition (ALD) method).

Example embodiments will now be described in detail with reference to the following examples. The examples are provided for illustrative purposes only and should not be construed as limiting the scope of example embodiments.

Example 1

RRAM Including a NiO Layer Having 0.05 wt % of a Ti Ion

A Pt electrode was formed on a substrate with a thickness of 50 nm. A NiO layer with a thickness of 500 Å and a size of 100 µm×100 µm having 0.05 wt % of a Ti ion was formed on the Pt electrode using a reactive sputtering method using a Ni target doped with 0.05 wt % of the Ti ion ($O_2$ partial pressure: 10 mol %, temperature during the sputtering: room temperature of about 25° C.). Then, a Pt electrode was formed on the NiO layer having 0.05 wt % of the Ti ion to prepare an RRAM.

Example 2

RRAM Including a NiO Layer Having 0.1 wt % of a Ti Ion

A RRAM was manufactured in the same manner as in Example 1 except that a NiO layer having 0.1 wt % of a Ti ion was formed using a Ni target doped with 0.1 wt % of the Ti ion instead of the Ni target doped with 0.05 wt % of the Ti ion.

Comparative Example 1

A RRAM was manufactured in the same manner as in Example 1 except that a pure Ni target was used instead of the Ni target doped with 0.05 wt % of the Ti ion and the sputtering temperature was about 400° C.

Evaluation Example 1

Figure 3:
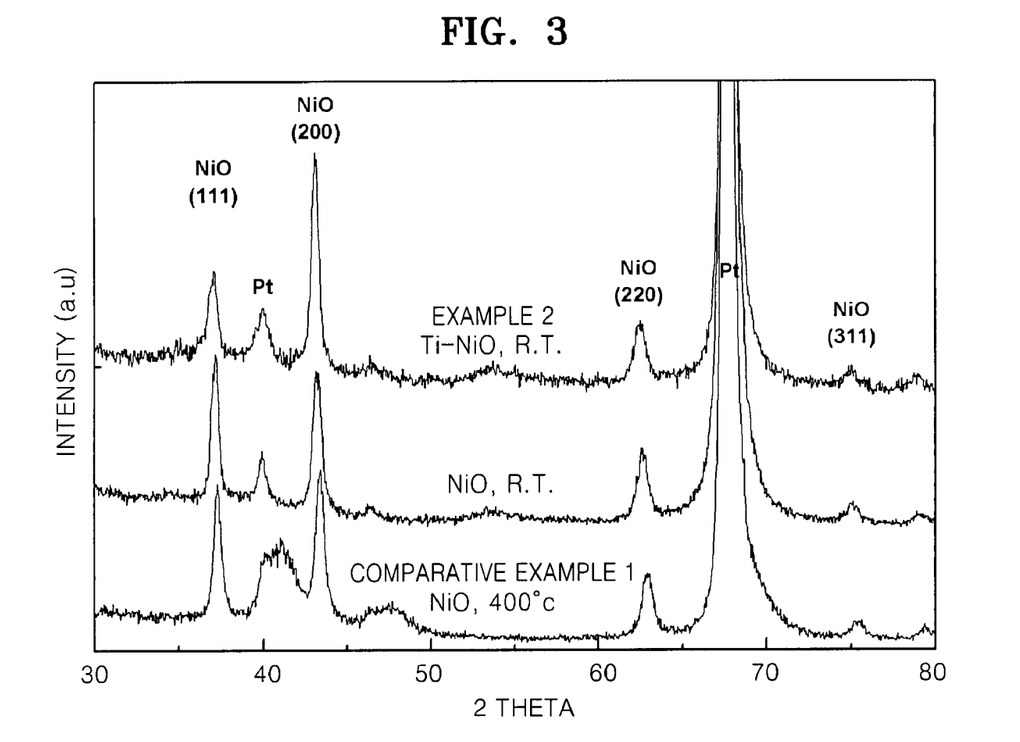
FIG. 3 is a graph illustrating XRD data of a resistance random access memory according to example embodiments and XRD data of a conventional resistance random access memory.

XRD data of the RRAM including the NiO layer (deposited at room temperature) having 0.1 wt % of the Ti ion obtained according to Example 2 and the RRAM including the pure NiO layer (deposited at about 400° C.) obtained according to Comparative Example 1 are shown in FIG. 3. XRD data of the RRAM including a pure NiO layer (deposited at room temperature) is also illustrated in FIG. 3 as NiO, R.T. for comparison.

Referring to FIG. 3, in terms of the XRD data of the RRAM including the pure NiO layer deposited at room temperature, the intensity was weaker as illustrated at NiO (200) and variable resistance characteristics were not found. On the other hand, in terms of the XRD data of the RRAM including the pure NiO layer deposited at about 400° C. obtained according to Comparative Example 1, the intensity was higher as illustrated at NiO (200) and variable resistance characteristics were found.

The shape of the XRD peak at NiO (200) in the RRAM including the NiO layer having 0.1 wt % of the Ti ion obtained according to Example 2 may be similar to the shape of the XRD peak at NiO (200) in the RRAM including the pure NiO layer deposited at about 400° C. having variable resistance characteristics obtained according to Comparative Example 1. Thus, the RRAM including the NiO layer having 0.1 wt % of the Ti ion as the resistance layer obtained according to Example 2 may have better resistance characteristics because the RRAM may have a higher peak intensity at NiO (200) even though the resistance layer was deposited at room temperature.

Evaluation Example 2

Figure 4:
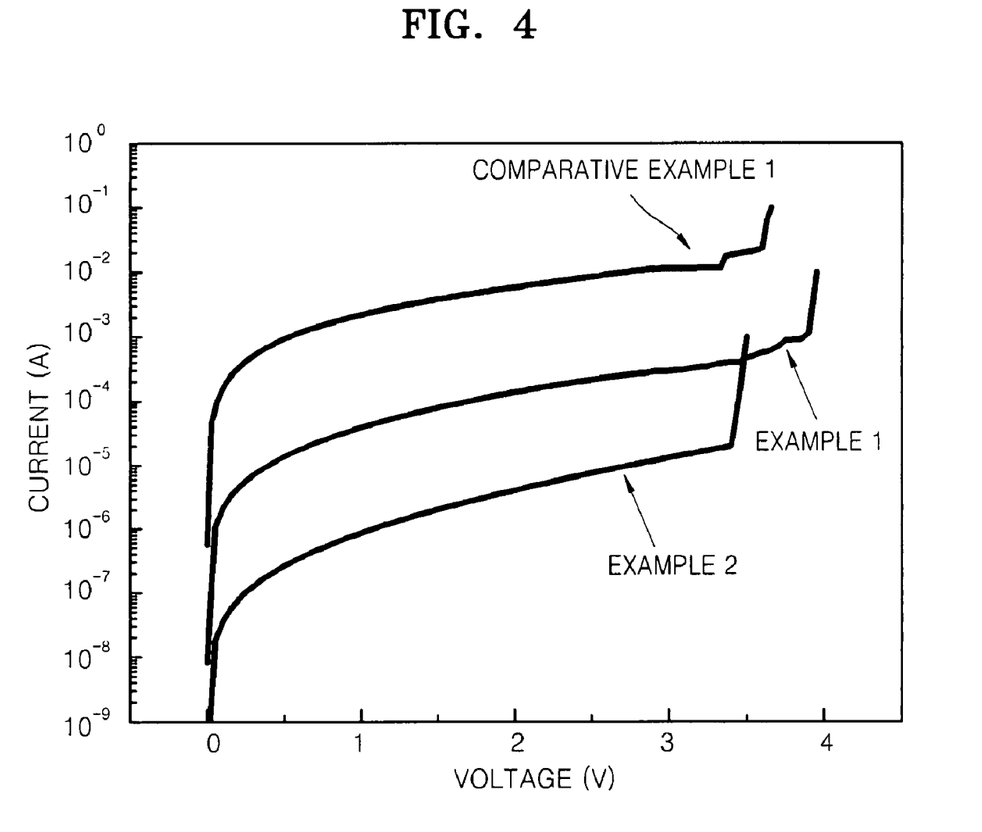
FIG. 4 is a graph illustrating current-voltage characteristics of a resistance random access memory according to example embodiments and current-voltage characteristics of a conventional resistance random access memory.

FIG. 4 is a graph illustrating current-voltage characteristics of the RRAM according to Example 1, Example 2, and Comparative Example 1, according to example embodiments.

Figure 5:
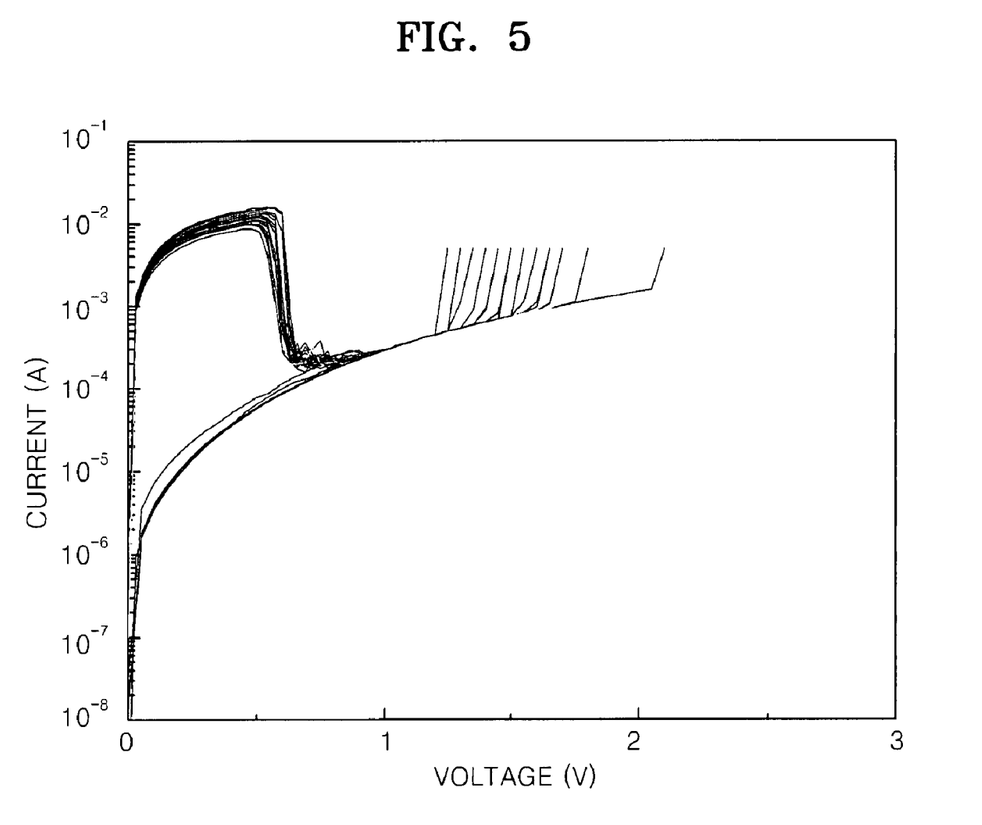
FIG. 5 is a graph illustrating variable resistance characteristics of a resistance random access memory according to example embodiments.

Referring to FIG. 4, the resistance of the RRAM as obtained in Examples 1 and 2 may be greater than the resistance of the RRAM as obtained in Comparative Example 1. The variable resistance characteristics of the RRAM according to Example 2 are shown in FIG. 5. Referring to FIG. 5, the resistance layer of the RRAM according to Example 2 may have better variable resistance characteristics even if the resistance layer of the RRAM is deposited at room temperature.

A resistance layer of a RRAM of example embodiments may have better variable resistance characteristics and may be deposited at a lower temperature in the range from about room temperature to about 200° C. Thus, the RRAM of example embodiments may be manufactured in a more cost-effective manner and may be used as a flexible device more reliably.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A resistance random access memory comprising:
   a lower electrode;
   a resistance layer having a metal oxide and a metal ion dopant on the lower electrode, a metal of the metal oxide being different than a metal of the metal ion dopant, the resistance layer configured to be variably resistive according to an applied voltage; and
   an upper electrode on the resistance layer.

2. The resistance random access memory of claim 1, wherein the metal oxide in the resistance layer is NiO.

3. The resistance random access memory of claim 1, wherein the metal ion dopant in the resistance layer is a transition metal ion.

4. The resistance random access memory of claim 1, wherein the metal ion dopant in the resistance layer is a Ti ion.

5. The resistance random access memory of claim 1, wherein the metal ion dopant in the resistance layer is substituted at a metal site of the metal oxide to be bound to oxygen.

6. The resistance random access memory of claim 1, wherein the metal oxide in the resistance layer is NiO and the metal ion dopant is a Ti ion.

7. The resistance random access memory of claim 1, wherein the amount of the metal ion dopant in the resistance layer is in the range of about 0.0001-5 wt %.

8. The resistance random access memory of claim 1, wherein the metal oxide in the resistance layer is at least one oxide selected from the group consisting of a Ni oxide, a Ti oxide, a Hf oxide, a Zr oxide, a Zn oxide, a W oxide, a Co oxide, and a Nb oxide.

9. The resistance random access memory of claim 1, wherein the metal ion dopant in the resistance layer is at least one ion selected from the group consisting of a Ni ion, a Ti ion, a Hf ion, a Zr ion, a Zn ion, a W ion, a Co ion, and a Nb ion.

10. A method of manufacturing a resistance random access memory, the method comprising:
    forming a lower electrode;
    forming a resistance layer having a metal oxide and a metal ion dopant on the lower electrode, a metal of the metal oxide being different than a metal of the metal ion dopant, the resistance layer being variably resistive according to an applied voltage; and
    forming an upper electrode on the resistance layer.

11. The method of claim 10, wherein the resistance layer is formed at about room temperature.

12. The method of claim 10, wherein the metal ion dopant in the resistance layer is substituted at a metal site of the metal oxide to be bound to oxygen.

13. The method of claim 10, wherein the resistance layer is formed by a deposition using a metal target doped with the metal ion dopant.

14. The method of claim 10, wherein the resistance layer is formed by a deposition using at least two metal targets.

15. The method of claim 10, wherein the resistance layer is formed using a sputtering, a chemical vapor deposition (CVD), a plasma vapor deposition (PVD), or an atomic layer deposition (ALD) method.

16. The method of claim 10, wherein the resistance layer is formed by a deposition using a Ni target doped with a Ti ion.

17. The method of claim 10, wherein the resistance layer is formed at a temperature in the range from about room temperature to about 200° C.

18. The method of claim 10, wherein the metal oxide in the resistance layer is at least one oxide selected from the group consisting of a Ni oxide, a Ti oxide, a Hf oxide, a Zr oxide, a Zn oxide, a W oxide, a Co oxide, and a Nb oxide.

19. The method of claim 10, wherein the metal ion dopant in the resistance layer is at least one ion selected from the group consisting of a Ni ion, a Ti ion, a Hf ion, a Zr ion, a Zn ion, a W ion, a Co ion, and a Nb ion.

* * * * *